United States Patent [19]

Kukanskis et al.

[11] Patent Number: 4,931,148

[45] Date of Patent: Jun. 5, 1990

[54] METHOD FOR MANUFACTURE OF PRINTED CIRCUIT BOARDS

[75] Inventors: Peter E. Kukanskis, Woodbury; Harold Rhodenizer, Bethlehem, both of Conn.

[73] Assignee: MacDermid, Incorporated, Waterbury, Conn.

[21] Appl. No.: 250,991

[22] Filed: Sep. 27, 1988

Related U.S. Application Data

[63] Continuation of Ser. No. 893,626, Aug. 6, 1986, abandoned.

[51] Int. Cl.⁵ .............................................. C25D 5/56
[52] U.S. Cl. ...................................... 204/15; 204/20; 204/30; 204/38.4; 427/97; 427/98; 427/307
[58] Field of Search .................... 204/38.4, 15, 30, 20; 427/97, 98, 305, 306

[56] References Cited

U.S. PATENT DOCUMENTS

| | | | |
|---|---|---|---|
| 3,562,038 | 2/1971 | Shipley | 156/3 |
| 3,672,925 | 7/1972 | Feldstein | 117/5.5 |
| 4,151,313 | 4/1979 | Wajima et al. | 427/98 |
| 4,537,799 | 8/1985 | Dorey, II et al. | 427/259 |
| 4,574,031 | 3/1986 | Dorey, II et al. | 156/655 |
| 4,666,739 | 5/1987 | Roubal | 427/97 |
| 4,668,532 | 10/1987 | Moisan et al. | 427/97 |

OTHER PUBLICATIONS

F. A. Lowenheim, *Electroplating,* McGraw-Hill Book Co., New York, 1978, pp. 421–423.

*Primary Examiner*—John F. Niebling
*Assistant Examiner*—William T. Leader
*Attorney, Agent, or Firm*—St. Onge, Steward, Johnston & Reens

[57] ABSTRACT

Printed circuit boards containing thru-holes requiring metallization are manufactured by first applying to the board material an alkaline strippable resist in a predetermined desired pattern, thereafter applying material catalytic to subsequent metallization, thereafter treating the board with an aqueous alkaline solution to remove catalytic material from resist surfaces without adversely affecting the catalyst at non-resist areas, and then metallizing the non-resist areas. The ability to preliminarily apply the resist pattern before catalyst application, metallization, etc., yet prevent metallization of the resist, enables the manufacturing process to proceed straight through the activation, metallization, etc. steps without need for interruption for resist application.

9 Claims, 3 Drawing Sheets

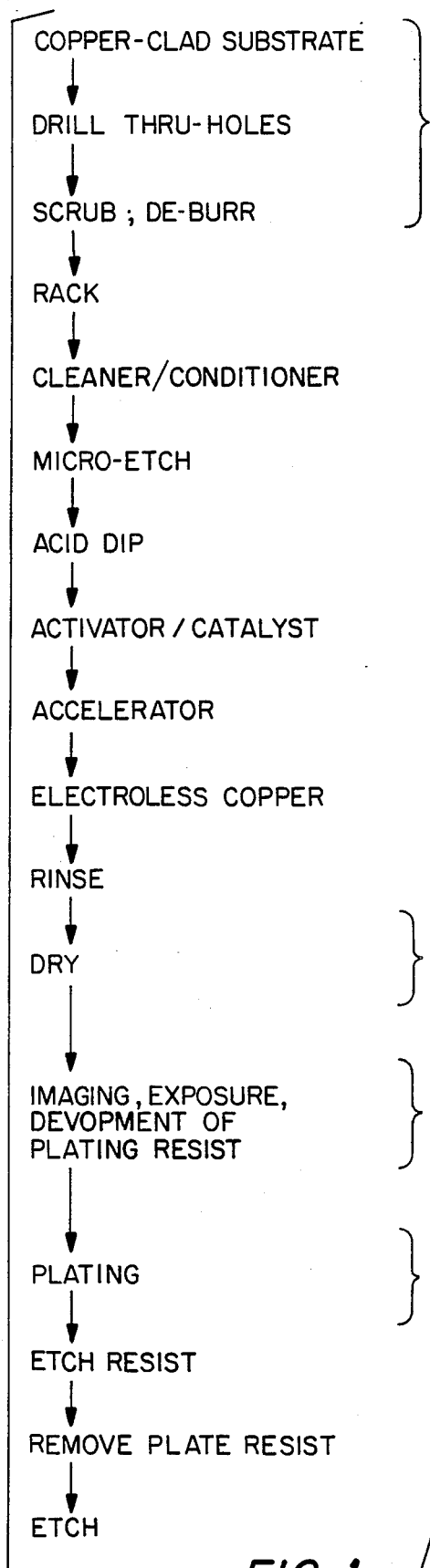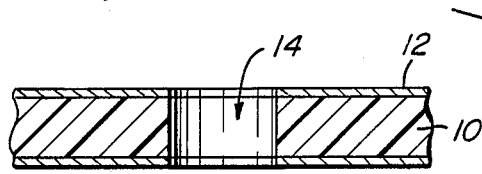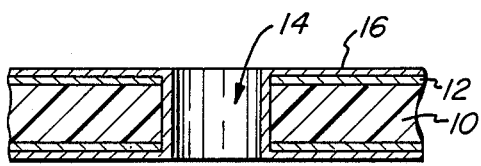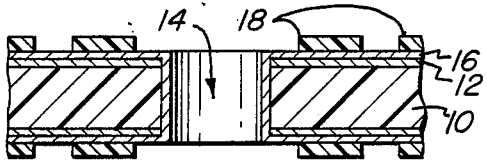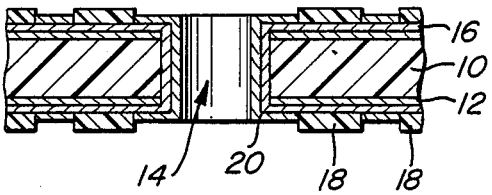
FIG. 1
FIG. 2

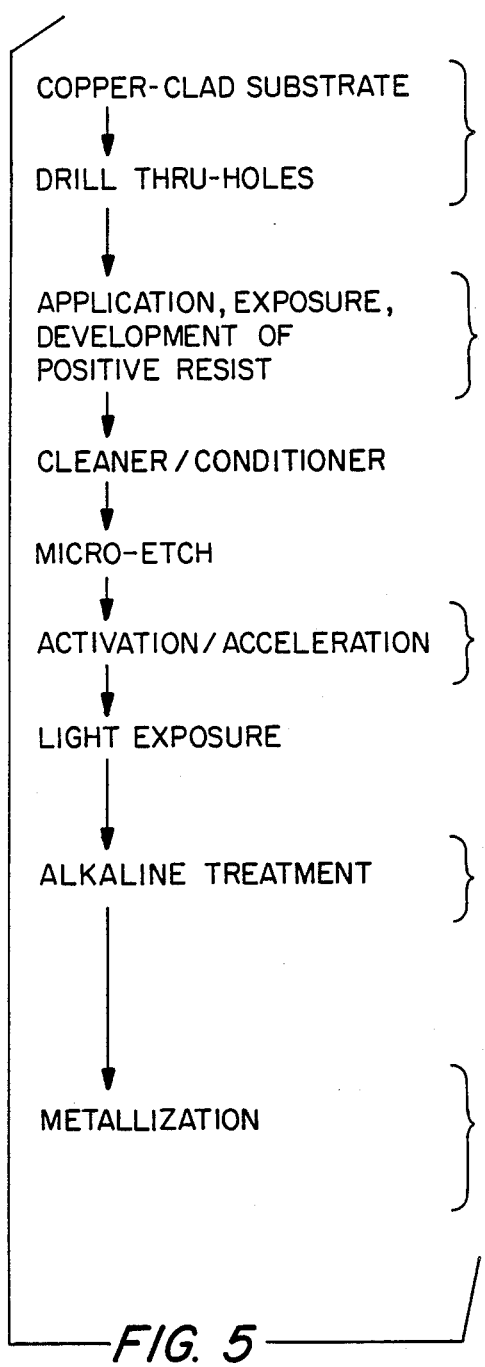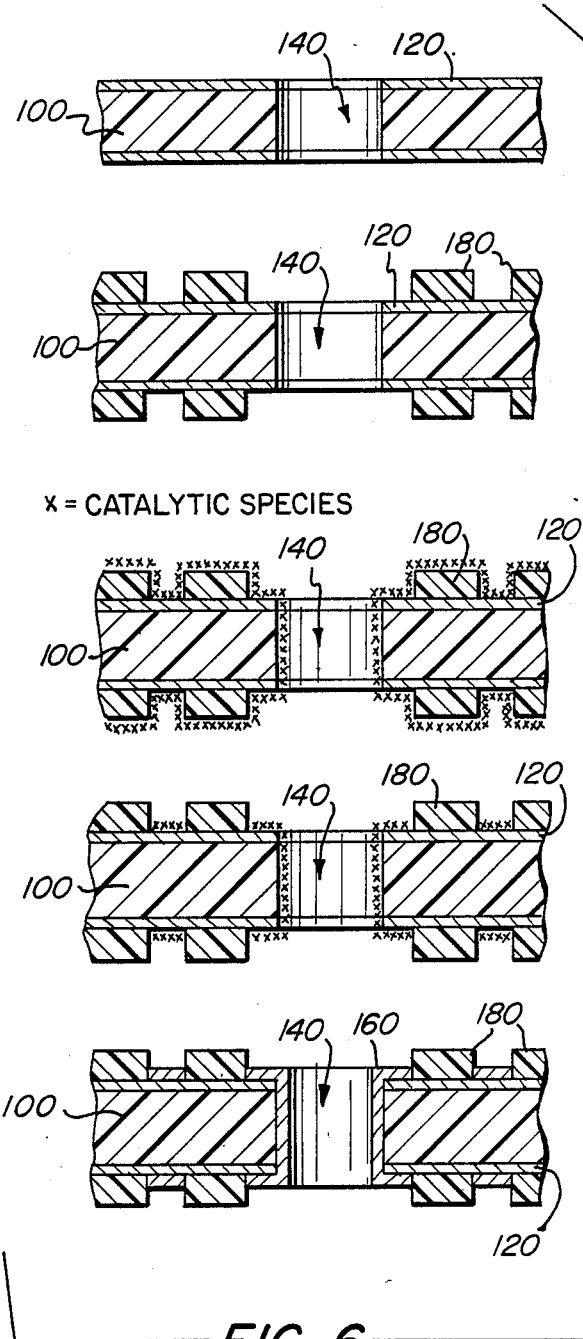
FIG. 5
FIG. 6

METHOD FOR MANUFACTURE OF PRINTED CIRCUIT BOARDS

This is a continuation of co-pending application Ser. No. 893,626, filed on Aug. 6, 1986, now abandoned.

BACKGROUND OF THE INVENTION

The present invention relates to the manufacture of printed circuit boards and, more particularly, to the manufacture of double-sided and multilayer printed circuit boards containing thru-holes requiring metallization.

In the manufacture of printed circuits, it is now common-place to provide planar boards having printed circuitry on each side thereof. Also gaining increased importance are so-called multilayer circuit boards comprised of integral planar laminates of insulating substrate and conductive metal (e.g., copper), wherein one or more parallel innerlayers or planes of the conductive metal, separated by insulating substrate, are present within the structure. The exposed outer sides of the laminate contain printed circuit patterns as in double-sided boards, and the inner conductive planes may themselves comprise circuit patterns.

In double-sided and multilayer printed circuit boards, it is necessary to provide interconnection between or among the various layers or sides of the board containing conductive circuitry. This is achieved by providing metallized, conductive thru-holes in the board communicating with the sides and layers requiring electrical interconnection. The predominantly-employed method for providing conductive thru-holes is by electroless deposition of metal on the non-conductive surfaces of thru-holes drilled or punched through the board.

A typical manufacturing sequence for producing double-sided or multilayer printed circuit boards containing metallized thru-holes is illustrated in the flow diagram, FIG. 1, and its accompanying FIG. 2 showing in cross-section and greatly expanded scale the corresponding structure of the board at particular steps in the sequence. In the sequence shown, there is first provided a copper-clad substrate consisting of a nonconductive substrate 10, typically an epoxy glass resin, having applied to it on both sides thin copper foil laminate 12. Thru-holes 14 are drilled in the laminated board, exposing hole surfaces of nonconductive substrate material 10. The board is scrubbed and the drilled holes deburred, followed by the variety of steps required to plate the thru-hole surfaces with conductive metal. Thus, the boards are generally racked, cleaned and conditioned, and subjected to a micro-etch process to render the copper surfaces receptive to adherence of subsequently-applied activator/catalyst; the drilled thru-holes generally are already sufficiently roughened by the drilling operation to render them receptive to catalyst adherence, although sometimes a glass etch is employed to frost exposed glass fibers, in those boards made of glass filled substrate resin, to improve plateability of the glass fibers. Although not shown in the flow diagram, cold water rinses are usually employed after each particular processing operation. The activator (catalyst) is then applied to the exposed surfaces, and the activator then accelerated as known in the art. Electroless copper 16 is then deposited on the activated surfaces resulting in metallization of the thru-hole surfaces. Additional metal build-up on the hole surfaces and at those areas which will define conductive circuitry (pads, traces, etc.) is then provided, after rinsing and drying of the board, by application of a plating resist 18 in a predetermined pattern (generally via application of a photoresist, exposure through a mask in the desired pattern and development or, alternatively, by screen printing of resist in the pattern), followed by, e.g., copper electroplating to provide additional copper 20. Desired metallized areas are then protected with an etch resist, the plating resist removed, and those areas unprotected by etch resist then etched down to the substrate surface.

There are a number of known variations on the foregoing sequence which are practiced in the art. The illustrated sequence typically is referred to as a "heavy deposition" process in which the layer of electroless copper deposited is about 80–100 millionths of an inch. In a variation, the electroless copper is deposited to a thickness of only about 15–20 millionths of an inch ("thin deposition"), and is then followed by an electrolytic copper strike layer of about 100–200 millionths of an inch for build up of metal prior to application of resist in desired pattern. In another variation, referred to as "panel plating", the thin deposition of copper is followed by a plating of electrolytic copper to the full or final thickness (e.g., 1 to 1.5 mil) before any application of resist takes place. In this variation, the patterned resist serves as an etch resist rather than a plating resist, the etch resist being applied to the fully built up areas of holes, pads, traces, etc. The unprotected areas of copper are then etched down to the substrate surface.

Irrespective of the particular variation employed, the foregoing sequences have in common the need for a number of process steps. However, in terms of the economics of actual manufacturing practice, the overall number of specific steps performed is actually of less consequence than the number of different types of steps. Thus, while plating of thru-holes via heavy or thin deposition per se involves a fair number of processing and rinsing steps, all the steps are basically wet processes performable in straightforward sequence during manufacture. More consequential from an economic point of view is the need to remove the board from this wet processing sequence, dry it, subject it to photo-imaging or screen printing, and then return it to a wet processing, plating and etching sequence. The same is true for panel plating where the electroless and electrolytic processes for build up of metal are interrupted for application of an etch resist and then returned to a wet processing etching step. These interruptions in process sequences, requiring physical transport and return of boards to and from different areas of the plant and intermediate drying sequences, can add significantly to the cost of manufacture.

SUMMARY OF THE INVENTION

It is an object of the present invention to provide a method for manufacture of double-sided and multilayer printed circuit boards containing thru-holes which require metallization.

Another object of the invention is to provide a manufacturing process of the type described which eliminates the earlier-noted disadvantages associated with interruptions of the manufacturing sequence.

A more specific object of the invention is to provide a method for manufacture of double-sided and multilayer printed circuit boards containing thru-holes requiring metallization, in which process a plating resist in a desired, pre-determined pattern is applied to the board surfaces prior to thru-hole metallization.

Yet another object of the invention is to provide a manufacturing process as just described in which the materials employed are processable using aqueous systems rather than organic systems.

In accordance with the invention, these and other objects are attained by the provision of a process for manufacturing double-sided and multilayer printed circuit boards containing thru-holes requiring metallization, in which process a desired, pre-determined pattern of aqueous alkaline-strippable plating resist material is, prior to metallization of the thru-hole, applied to the board surfaces to define areas where build up of metal is not desired; the surfaces of the board, including thru-hole surfaces and resist surfaces, are then subjected to processes which activate such surfaces for acceptance of metal; the board is then subjected to treatment with aqueous alkaline medium under conditions effective to selectively inactivate the surfaces of the previously-applied resist to subsequent metallization without either destroying the integrity of the resist or inactivating surfaces where metallization is desired; and the board is then treated to apply a metallized layer on those surfaces thereof, including thru-hole surfaces, active toward such metallization.

In accordance with specific embodiments of the invention, the metallization following application of the resist, activation of all surfaces, and selective inactivation of the surfaces of the resist, can be conducted electrolessly or electrolytically, and can comprise a combination of plating techniques and steps to attain the desired thickness of metal on thru-hole surfaces and other portions of the board surfaces such as hole pads and traces. Thereafter, conventional processes are employed for application of the etch-resistant coatings on areas of holes, pads, traces, etc., followed by etching of metal down to the substrate surface, followed by other standard finishing processes.

In the method of the invention, application of the plating resist in the desired pre-determined pattern prior to initiation of the metallization process results in the ability to then process the board straight through the various wet steps of plating, rinsing, etching, etc. without the interruption necessitated in the known techniques. As a consequence, considerable saving is realized in manufacturing time and expense. Additional advantages which accrue from the utilization of the present invention will be apparent from the more detailed discussion which follows.

PRIOR ART

In U.S. Pat. No. 4,537,799 to Dorey II, et al., a selective electroless metallization process is described in the context of printed circuit board manufacture of the additive type. According to the process, an insulating substrate is drilled to form desired thru-holes and a negative resist pattern then formed over a surface of the substrate to delineate the desired circuit pattern in the areas not coated by the resist, the resist being an organic solvent-strippable/soluble photoresist or ink. The substrate and resist surfaces are then etched to increase adhesion thereto of a subsequently-applied catalytic layer and electroless metal layer. In accordance with one embodiment described, the board is then treated with weak acid (acetic, formic, propionic) to cause mild dissolution or smoothing of the resist surface without substantial attack on the substrate, by which adhesion of subsequently-applied catalyst on the treated resist is essentially eliminated. Thereafter, catalyst is applied and electroless metal deposition conducted to metallize those areas not covered by the resist. In another described embodiment, catalyst is first adhered to the etched substrate and resist and the board thereafter treated with weak acid to dissolve a small amount of the resist and thereby remove catalytic material therefrom and/or to inactivate the catalytic species on the resist. Electroless deposition on the areas not coated by resist then follows. A significant disadvantage of the Dorey II procedure is the reliance upon solvent-strippable/soluble resists and acidic treatment materials therefor.

U.S. Pat. No. 4,388,351 to Sawyer also relates to additive-type manufacture of printed circuit boards and selective metallization thereof. A negative resist pattern is formed on the insulating substrate using solvent strippable/soluble resist materials, all surfaces etched, all surfaces sensitized and catalyzed to electroless copper deposition, the resist stripped and electroless copper deposited over the catalytic image remaining. Alternatively, a flash plate of electroless copper is first deposited over all surfaces, including resist surfaces, prior to stripping of the resist; after the resist (and the metal flash coating thereon) is stripped, a further build up of electroless copper is made on the remaining flash plate pattern. Since metallization and/or full metallization in desired areas is performed after resist stripping, a serious disadvantage of the Sawyer process, as discussed in the earlier-mentioned U.S. Pat. No. 4,537,799 to Dorey II, et al., is the inability to precisely control the desired line width in the metallized areas.

U.S. Pat. No. 4,574,031 to Dorey II, et al. is similar to the additive-type process of Sawyer in that a photoresist mask is applied on the surface of an insulating substrate in desired pattern, all surfaces (i.e., both exposed substrate surfaces and resist surfaces) catalyzed to electroless metal deposition, a thin flash plate of electroless metal deposited on all surfaces, followed by removal of the mask (and with it the flash plate thereon). Additional metal is then built up over the remaining flash plate by electroless deposition. While extending the teachings of Sawyer to aqueous alkaline soluble and strippable photoresists, this process of Dorey II, et al. nevertheless still suffers the same disadvantages of Sawyer, viz., inability to precisely control desired line widths in the metallized areas by reason of the fact that the additional build up of metal is conducted without presence of a resist mask. Moreover, as pointed out in the earlier-mentioned U.S. Pat. No. 4,537,799 to Dorey II, et al., processes of the Sawyer type are critically dependent upon attainment of a particular thickness of the flash plate. Of most importance, if the flash plate applied over the resist is too thick, stripping of the resist can be extremely difficult and may result in there remaining on the board unwanted and undesirable slivers of metal in areas where no metal should be present.

In U.S. Pat. No. 4,151,313 to Wajima, et al., a process for manufacturing a printed circuit board is described in which a plating resist, consisting of a thermosetting resin containing a solid solution of titanium, nickel and antimony oxides, is applied in a negative pattern on a substrate, and all surfaces of the substrate and resist then catalyzed to electroless metal deposition. Catalyst is then removed from the surface of the resist by contact with a hydrochloric acid solution of ammonium persulfate, without effect on the resist material per se or on catalyst present on substrate surfaces, and electroless plating then proceeds on the remaining catalyzed substrate surfaces. According to the patent, the metal oxides in the resist convert the applied catalyst to a compound which is readily dissolvable in the inorganic acid solution. A significant drawback of the Wajima, et al. process is the requirement for use of thermosetting resist materials of particular composition and the inability to conduct the process employing photoresists.

U.S. Pat. No. 3,562,038 to Shipley, Jr., et al. relates to selective electroless metallization of substrate surfaces and is described as being useful for manufacture of printed circuit boards. According to the patent, a substrate is selectively treated (e.g., mechanically or chemically roughened) to provide areas thereon selectively more retentive of an absorbed colloidal electroless deposition catalyst than untreated areas. The colloidal catalyst is then applied to all areas, the entire substrate contacted with a stripper solution to remove catalyst from all areas except the selectively retentive areas, and the substrate then electrolessly plated. A thru-hole metallization process is described in which thru-holes are formed in a substrate, the substrate contacted with colloidal catalyst, the substrate then contacted with a stripper solution for removal of catalyst from all areas except the thru-holes, and electroless metal then deposited selectively on the thru-holes. In another described embodiment, a circuit board substrata is roughened, a reverse resist image of a circuit pattern applied on the substrate, the substrate dipped in colloidal catalyst solution, then dipped in a stripping solution (copper chloride, hydrochloric acid (37%), water), then dipped in electroless copper plating solution resulting in plating only in thru-holes and on exposed roughened substrate surfaces, and then subjected to electroplating to deposit electrolytic copper over electroless copper areas. The prior art has reported that the foregoing method, in practice, nevertheless results in electroless metal deposition on the resist.

BRIEF DESCRIPTION OF THE DRAWINGS

FIG. 1 is a flow diagram of a conventional method for manufacture of printed circuit boards containing thru-holes;

FIG. 2 shows in cross-section the thru-hole area of a printed circuit board at various stages in the process sequence shown in FIG. 1;

FIG. 5 and FIG. 6, respectively, illustrate a flow diagram sequence and corresponding cross-sectional structure for another embodiment of the invention.

Figure 4:
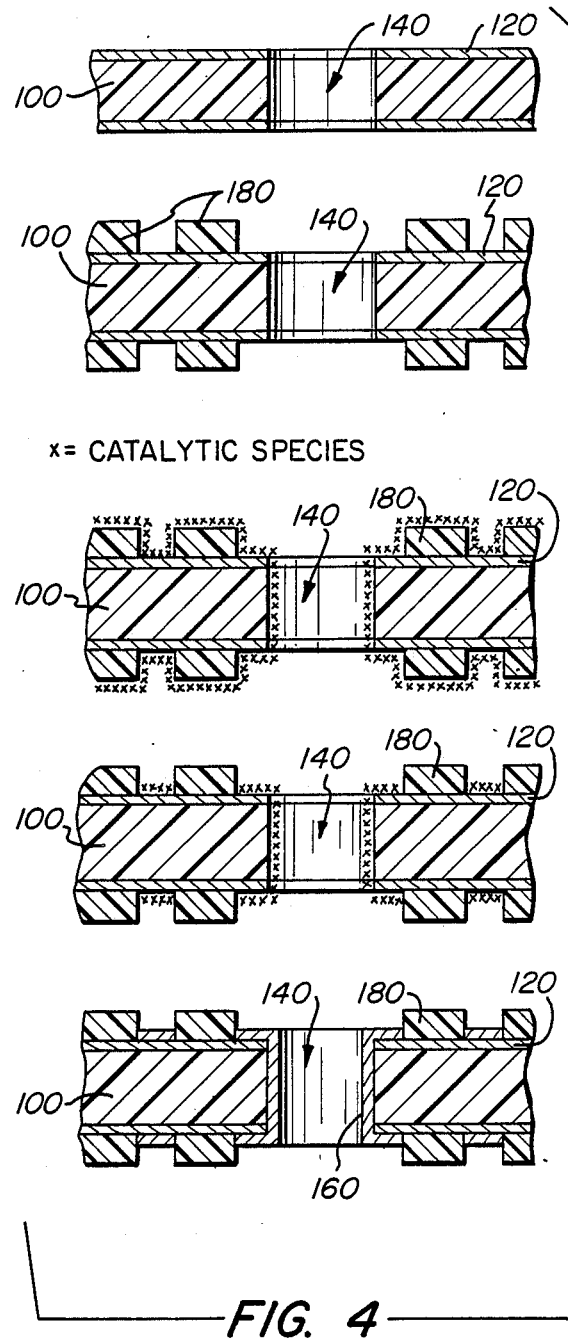

In each of the structure-illustrating drawings, i.e., FIGS. 2, 4 and 6, the holes and pads shown are associated with traces other than those in the drawings, and the traces shown are associated with pads and holes other than those shown in the drawings.

DETAILED DESCRIPTION OF THE INVENTION

In the process of the invention, a resist is applied in a pre-determined, desired pattern to a suitable double-sided or multilayer metal-clad circuit board substrate, containing one or more thru-holes, prior to metallization of the thru-hole surfaces, to define those areas where resistance to plating is desired. The resist material chosen must be one which, in its developed, set or cured condition, is capable of being acted upon by an aqueous alkaline solution to effect inactivation of its surfaces to subsequent electroless metal deposition notwithstanding previous application thereto of catalyst. In addition, the resist material must also, of course, be resistant to acceptance of subsequently-applied electroplated metal layers, and must be capable of eventually being completely stripped from the substrate surface.

As utilized herein, "inactivation" of the surfaces of the resist has reference to the situation of a metal-clad printed circuit board substrate, on which a resist has been applied in a desired pattern, which is then non-selectively treated to catalyze or "activate" all surfaces to acceptance of deposited metal. According to the invention, the so-treated substrate, prior to metal deposition, is contacted with an aqueous alkaline solution under conditions which selectively remove, or permit removal of, catalyst from the resist surfaces, thereby "inactivating" such surfaces in the sense of rendering them non-receptive to metal deposition. The mechanism of this inactivation essentially involves a stripping from the resist surfaces of the catalyst layer thereon. This stripping can, and usually does, involve stripping from the resist surfaces of only the catalyst layer without any dissolution of the resist per se, the aqueous alkaline solution here performing a softening of the resist surface which permits the catalyst layer to be stripped therefrom by that solution or in a subsequent rinse. The invention also has within its scope, however, a "stripping" of the catalyst layer by virtue of actual dissolution by the aqueous alkaline solution of a very thin portion of the underlying resist surface on which the catalyst is carried. In either case, inactivation of the resist toward metal deposition is effected because the resist surfaces remaining after this treatment with aqueous alkaline solution no longer possess the requisite catalyst species.

Within the limitations previously set forth as to the inherent qualities which must be possessed by the resist, the particular resist chosen may be selected from a relatively wide variety of resist types. Particularly preferred are photosensitive resist materials (photoresists), and within this category the resists may be either negative or positive working. In a negative-working photoresist, a developable photosensitive material is uniformly applied t the substrate surface and then light-exposed through a mask exhibiting the desired artwork configuration. Those areas of the resist exposed to light become "insolubilized" (cross-linked), while those areas not so exposed (in the pattern of holes, pads, traces, etc.) remain in a form which permits dissolution and removal with a suitable developer. In positive-acting resists, the exposed areas (pads, holes, traces, etc.) are converted to a solubilized form which permits their dissolution and removal, while the unexposed areas remain as the resist. Whether negative or positive working, the photoresists may be of the dry film or liquid type.

The resist material, subject to the earlier-noted requirements, can also be of the non-photosensitive type, i.e., thermosetting or curable resins. These types of resins are applied to the board surfaces in the desired pattern through well-known screening techniques.

Figure 3:
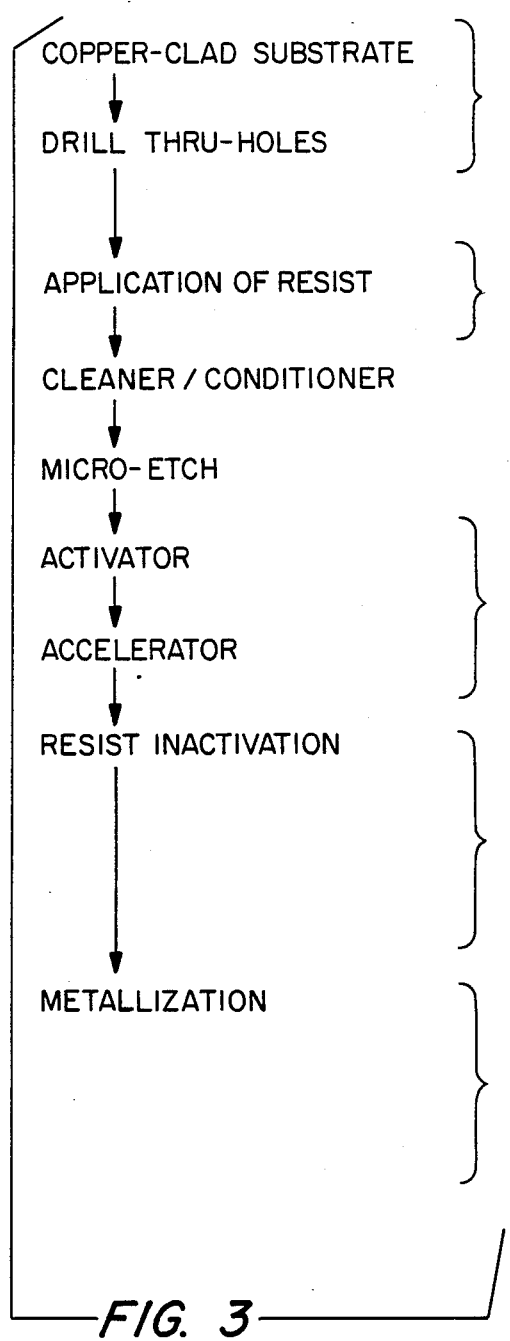
FIG. 3 and FIG. 4, respectively, illustrate a flow diagram sequence and corresponding cross-sectional structure for one embodiment of the invention.

Referring to FIG. 3 and FIG. 4, one particular embodiment of the invention begins with an insulating substrate 100 which is clad on both sides with a thin metal foil 120 (e.g., copper). The insulating substrate typically will be a glass reinforced epoxy substrate or a polyimide-type substrate. In general, however, any insulating thermosetting resin, thermoplastic resin or combination thereof may be employed, including fiber impregnated forms thereof, such as allyl phthalates, epoxy resins, polyesters, acrylics, polyethylene, ABS copolymers and the like. The board will have one or more thru-holes 140 drilled or punched therein which require metallization to provide conductive connection between circuits to be formed on each side of the board.

In the next step in the process, a resist material 180 is applied to the board in the form of a desired, predetermined pattern to define areas of the board surface where metallization is not desired. As noted, the resist must possess the capability of being acted upon by an aqueous alkaline solution to inactivate the resist surfaces vis-a-vis metal deposition, notwithstanding previous application thereto of catalytic species otherwise capable of promoting acceptance of such metal deposition, such inactivation being attainable under conditions which will neither adversely attack or undercut the resist, nor strip the resist in its entirety from the board, nor remove and/or inactivate catalytic material present on exposed board areas where metallization is required. Particularly preferred in this regard are negative-acting, photosensitive dry film type resists which are strippable in aqueous alkaline medium (such as, for example, Riston 3600 series, particularly Riston 3615, available from E. I duPont deNemours & Co.; the Riston 200 series photoresists, also from duPont; Aquamar photoresists from Hercules; Dynachem HG; and the photoresist known as Type 1038MW from Nichigo Alpho of Japan), and non-photosensitive, screen-printable, alkaline-strippable type resists, particularly those of the acrylic base type which cure to smooth, glossy surfaces. After exposure/development or curing as the case may be, the board with applied resist generally is rinsed in water, acid cleaned, rinsed in water, contacted with conditioner and rinsed again. Thereafter, the board surfaces are contacted with a microetchant (e.g., dilute peroxide/sulfuric acid solution), rinsed, and then activated with material catalytic to subsequent metallization.

For electroless metallization, activation of the surfaces will generally comprise contact with one-step colloidal tin-palladium solutions, such as hydrochloric acid solutions of stannous chloride and palladium chloride, to form a palladium catalytic layer on the surfaces as is well known in the art. The activation may, however, also be effected by means of two-step tin/palladium systems or by means of non-noble metals such as copper compounds. After activation, particularly when colloidal tin-palladium solutions are used for activation, an accelerator solution generally will be employed to attain increased activity and stabilization of the catalytic species.

At this stage in the process it is found that sufficient active catalyst exists on the surfaces of the resist material to cause undesired metallization of the resist in addition to the desired metallization of thru-holes, pads, traces and other areas not covered by resist. In accordance with the invention, the board is now contacted (e.g., sprayed with, dipped in) a dilute aqueous alkaline solution under conditions which result in inactivation of the resist surfaces, i.e., removal from the resist of the catalytic layer, either by softening of the resist surface sufficiently to permit removal therefrom of the catalytic layer or by dissolution of a thin layer of resist on which the catalyst is carried or affixed. At the same time, however, it must be insured that the resist will not be attacked or undercut or completely stripped from the board, and also that catalytic species adhered to areas where metallization is required are not removed and/or adversely altered to any substantial degree.

To achieve these ends, relatively dilute alkaline solutions of soluble carbonates, hydroxides, borates and the like are employed, particularly water-soluble sodium or potassium forms thereof. Since the resist materials deliberately are chosen to eventually be completely strippable in aqueous alkaline medium, it is necessary to insure that the operating conditions of this step, e.g., the basicity of the solution and the time and temperature of contacting, not be so severe as to promote too rapid or aggressive an attack on the resist or risk inactivation of non-resist board areas. Generally, the pH of the aqueous alkaline solution should be in the range of from about 8 to 11.5, and preferably from about 8.5 to 11. The temperature at which the board is contacted with the solution generally will be in the range of from about 70° F. to about 130° F., preferably from about 90° F. to about 110° F. The time of contacting will be chosen so as to be sufficient to insure that the catalytic layer will be removed from the resist, yet not so long as to risk too extensive dissolution of resist and/or inactivation of catalyst present on areas where metallization is desired.

After rinsing in water, the board is now ready for metallization of thru-hole surfaces and other surfaces not covered by resist. Most typically, the metallization process will comprise an electroless deposition of metal (e.g., FIG. 4, layer 160), generally copper, which deposition may then be followed by additional electrolytic deposition of the same or dissimilar metal. By way of example, the metallization may comprise electroless copper followed by electrolytic copper. In either case, this metallization may be followed by electrolytic application thereover of a suitable etch resist (e.g., tin-lead), stripping off of the plating resist and etching of the unprotected areas down to the substrate surface. The metallization may also comprise a wholly electrolytic process, such as metallization with electrolytic copper.

Irrespective of the particular metallization technique, the earlier-imposed requirements for the resist material which permit catalyst inactivation thereon, also result in imposition of requirements upon the metallization process. In particular, in order to insure that the resist material will not dissolve during the plating operation, the plating solutions must not be highly alkaline. For electroless plating, this requirement precludes use of the known formaldehyde-based electroless baths which are strongly alkaline (pH of 11 to 13). However, electroless plating baths which are based upon hypophosphite reducing agents can effectively be employed since their range of operability extends into the low alkaline and weak acid range with suitably chosen complexing agents. See, e.g., U.S. Pat. Nos. 4,209,331 and 4,279,948 to Kukanskis, et al. for suitable electroless copper baths. The resists chosen for attainment of the goals of the invention will not be dissolved in these baths at the conditions of use. Where metallization is conducted in whole or in part via electrolytic processes, suitable acid copper and like baths are known.

As noted earlier, the process of the present invention may be carried out using resists of various types, provided they possess the required characteristics regarding catalyst inactivation in aqueous alkaline solutions under particular conditions. FIGS. 5 and 6 illustrate an embodiment of the invention which employs positive-acting photosensitive resists. As in the previous embodiment, a metal foil-clad substrate (100; 120) with thru-holes 140 has applied to it a photosensitive material 180, in this case a positive-acting photoresist, which is exposed through a light mask of predetermined pattern and then developed to dissolve away areas which were exposed and leave on the board surface unexposed resist in the areas where metallization is not required. The board is then subjected to the various cleaning, conditioning, etching and activation/acceleration steps as before. The resist surfaces now are found to contain sufficient active catalytic species to result (undesirably) in their metallization during plating. As before, the nature of the resist permits removal of the catalytic species therefrom using a dilute aqueous alkaline solution. Because positive resists are involved, it also is possible to effect this inactivation by brief exposure of the entire board to ultraviolet light for a time just sufficient to decompose and solubilize the outer surfaces of the resist. This step can then be followed by a rinsing step to remove the affected thin portion. It is generally preferred, as shown in FIG. 5, to combine both techniques, i.e., to first expose the board briefly to ultraviolet light and then to contact the board with aqueous alkaline solution. After this treatment, metallization 160 follows as earlier discussed.

Although the foregoing embodiments illustrate metallization of thru-holes in double-sided printed circuit boards, it will be apparent that the identical processes may be employed for multilayer boards. As is known in the art, processes for plating of thru-holes drilled in multilayer boards will generally require a desmearing step to remove from exposed metal innerlayer surfaces any resin smeared thereon in the hole drilling process. Typical desmearing techniques include chemical (e.g., chromic acid, concentrated sulfuric acid), mechanical (e.g., vapor honing, secondary drilling) or other (e.g., plasma etching) means, which can be followed by other specialized treatments to thereafter condition the thru-hole surfaces for receipt of activating species and metallization. See, for example, Kukanskis, "Improved Smear Removal", CIRCUITS MANUFACTURING, March, 1983, pp. 573-574, and commonly-assigned U.S. Pat. No. 4,597,988. In terms of the context of this invention, such desmearing processes can be conducted either prior to or after application of resist to the substrate surface.

Of particular utility in the process of the present invention is the activation/acceleration described in commonly-assigned pending patent application Ser. No. 712,981 of Kukanskis, et al. entitled "Oxidizing Accelerator" (Issue Fee paid Apr. 22, 1986), incorporated herein by reference, in which a one-step catalyst activation process using a palladium/tin sol is followed by acceleration with an alkaline solution containing an oxidizing agent, such acceleration being particularly useful in conjunction with subsequent electroless plating in hypophosphite reduced, formaldehyde-free plating baths as are employed herein. Owing to the nature of these preferred acceleration solutions, i.e., their alkalinity and aqueous nature, it is possible in the context of the process of the present invention to utilize such solutions as the means for inactivating the resist surfaces while simultaneously accelerating catalyst absorbed on non-resist surfaces of the board. Generally and preferably, however, owing to differing requirements of alkalinity and operating temperatures, separate steps of acceleration and inactivation of resist surfaces (in either order) will be conducted where metallization is to be via electroless deposition.

Although in the embodiments described, metallization with copper will typically be employed, any other metal capable of being deposited under conditions which will not dissolve the specially chosen resists can be used.

The present invention is described in detail with respect to printed circuit board manufacture since it is in this field that the advantages of the process are most readily apparent and significant. The process, in permitting application of a patterned resist before commencement of and plating process, provides a vast improvement over conventional processes since the metallization process, etching, etc. can be conducted without need for interruption to perform the required resist application. As compared to other processes which might have applicability toward the same goal, the process of the invention affords the ability to attain fine-line definition, to employ photosensitive resist materials, and to avoid the hazards and disposal problems associated with utilization of organic solvents to dissolve resist material. While highly advantageous, then, for manufacture of printed circuit boards of the double-sided or multilayer type in which thru-holes require metallization, the invention also will have applicability in any process requiring metallization of a substrate surface in a predetermined pattern, particularly where fine detail or improved economics are required.

The process of the invention is further illustrated in the following examples.

EXAMPLE I

A glass-reinforced epoxy substrate having copper foil laminated thereon is provided with drilled thru-holes which are scrubbed and deburred. The board is then coated with Riston 3615, a dry-film photosensitive negative resist. After exposure through a mask in the desired pattern, the resist is developed in a solution of 10 g/l sodium carbonate, rinsed with water and subjected to the following process cycle (with intervening water rinses where appropriate):

1. Contact for 2 minutes at 110° F. with acid cleaner (MacDermid 9268);

2. Contact for 2 minutes at room temperature with conditioner solution (MacDermid 9420), 1.5% (vol) in water;

3. Contact for 1 minute at room temperature with micro-etch solution (MacDermid G4), 60 g/l with 5% (vol) sulfuric acid;

4. Contact for 3 minutes at 90° F. with activator solution MacDermid Mactivate 10, 1.5% by volume with 50% by volume MacDermid 9008 and 5% (vol) hydrochloric acid;

5. Contact for 5 minutes at 100° F. with an aqueous solution of sodium carbonate, 10 g/l and dimethyl amine borane (reducing agent), 0.5 g/l, pH=11.5, to effect inactivation of the resist surfaces by removal of catalyst layer therefrom (with no apparent dissolution/removal of resist as indicated by absence of blue (resist color) in contacting solution);

6. Contact for 2 to 5 minutes at 130° F.-140° F. with oxidizing accelerator (aqueous solution of sodium hypochlorite, with sodium bicarbonate to pH 8.5-9.0);

7. Electroless copper plating, 5 minutes at 130° F. in hypophosphite-reduced, formaldehyde-free electroless copper bath, MacDermid 249-T, pH=9;

8. Acid dip in 5% (vol) sulfuric acid;

9. Electroplate in acid copper electroplating bath. Examination of the board at various stages in this process showed that no metal plating occurred on the resist surfaces and no attack of the resist noted (which would be evidenced by wrinkling or puckering of the resist, particularly along the edges of the pattern defining traces or pads). Copper coverage on thru-holes was excellent.

In specific variations of the above sequence, steps 5 and 6 can be interchanged, and the reducing agent in the solution of step 5 can be eliminated.

EXAMPLE II

The process of Example I was repeated through the first four steps on four (4) separate boards (Samples A through D). Thereafter, the samples were subjected to the following steps:

5. Contact with aqueous solution of sodium carbonate, 10 g/l and dimethyl amine borane, 0.5 g/l, pH=11.5, contacting time and temperature as follows:
   Sample A-5 minutes, 88° F.
   Sample B-5 minutes, 100° F.
   Sample C-5 minutes, 120° F.
   Sample D-2 minutes, 120° F.
6. Acid dip, 5% sulfuric acid, room temperatures; and
7. Electroplate in acid copper electroplating bath, MaCuSpec 9239 (MacDermid, Inc.).

All board samples exhibited good copper coverage in the thru-holes, indicating that none of the treatments effected significant (if any) removal of catalyst from non-resist surfaces. Sample A showed no attack of the resist, but some plating occurred on the resist surfaces, indicating insufficient inactivation of those surfaces. Sample C evidenced resist attack. Samples B and D showed no resist attack and no plating of metal on resist surfaces, indicating achievement of the desired inactivation without adverse effect on the adherence of the resist and its ability to finely-define traces, etc.

EXAMPLE III

The procedure of Example II was repeated on three (3) boards (Samples E, F, G). In place of the step 5 shown in Example II, the samples were contacted with ar aqueous solution of borax, 10 g/l, and dimethyl amine borane, 0.5 g/l, pH=9.5, as follows:
   Sample E-5 minutes, 100° F.
   Sample F-2 minutes, 120° F.
   Sample J-5 minutes, 120° F.
Thru-holes of all samples showed good copper coverage. No metal plating was found on resist surfaces in any of the samples. Samples E and F evidenced no resist attack, while very slight resist attack was noted for Sample G.

EXAMPLE IV

The procedure of Example II was repeated on three (3) boards (Samples H, I, J), with step 5 employing a pH of 8.3 and the following times and temperatures of contacting:
   Sample H-5 minutes, 100° F.
   Sample I-2 minutes, 120° F.
   Sample J-5 minutes, 120° F.
All samples showed good copper coverage in the thru-holes holes, but Samples H and I displayed metal plating on the resist surfaces. Sample J evidenced no resist attack and no plating on resist surfaces.

As indicated, the foregoing description is provided to describe and enable practice of the invention and the best mode known for carrying it out, but, except where expressly indicated, is not to be considered as restricting the invention to any particular illustrative sequences, materials or conditions set forth.

What is claimed is:

1. A method for metallizing thru-holes formed in a metal-clad printed circuit board substrate material and for providing at the same time additional metallization of selected metal-clad surfaces of said metal-clad printed circuit board substrate material, comprising the steps of:
   (a) providing a metal-clad printed circuit board substrate material having one or more thru-holes therein;
   (b) applying a resist which is strippable in aqueous alkaline medium to selected surfaces of said metal-clad printed circuit board substrate material in a predetermined pattern to define those surfaces areas, over which resist is applied, where additional metallization is not desired;
   (c) thereafter contacting said metal-clad printed circuit board substrate material, having said patterned resist thereon, with a conditioner;
   (d) thereafter contacting said conditioned metal-clad printed circuit board substrate material, having said patterned resist thereon, with a microetchant;
   (e) thereafter contacting said conditioned and microetched metal-clad printed circuit board substrate material, having said patterned resist thereon, with catalytic species which promote metallization, resulting in the provision of said catalytic species on thru-hole surfaces, resist surfaces and the surfaces of said metal-clad printed circuit board substrate material not covered by said resist;
   (f) thereafter contacting at least said resist surfaces of said metal-clad printed circuit board substrate material with an aqueous alkaline deactivating solution under conditions which substantially inactivate said resist surfaces to metallization without substantially removing the resist surfaces and without inactivating said thru-hole surfaces and the surfaces of said metal-clad printed circuit board substrate material not covered by said resist; and
   (g) thereafter immersing said metal-clad printed circuit board substrate material, having said patterned resist thereon, in a metallizing solution effective to metallize said thru-hole surfaces and the surfaces of said metal-clad printed circuit board material not covered by said result, with substantially no metallization occurring on said resist surfaces.

2. The method according to claim 1 wherein said metallizing solution of step (g) is an electroless metal depositing solution.

3. The method according to claim 2 further comprising, subsequent to step (g), building up additional metal coating on the surfaces metallized in step (g) by immersing said metal-clad printed circuit board substrate material, having said pattern resist thereon, in a metal electroplating solution effective to deposit additional metal over said metallized areas but not on said resist surfaces.

4. The method according to claim 1 wherein said metallization solution of step (g) is a metal electroplating solution.

5. The method according to claim 1 wherein said aqueous alkaline deactivating solution has a pH in the range of from about 8.0 to about 11.5.

6. The method according to claim 5 wherein said aqueous alkaline deactivating solution is an aqueous solution of an alkaline material selected from the group consisting of hydroxides, carbonates, borates, and mixtures thereof.

7. The method according to claim 1 wherein said metal-clad printed circuit board substrate material is a multi-layer printed circuit board substrate material comprised of one or more metal innerlayer planes separated by planes of insulating material.

8. The method according to claim 1 wherein said metal-clad printed circuit board substrate material is copper-clad.

9. The method according to claim 8 wherein said metallizing solution is effective to deposit copper metal on said thru-hole surfaces and the surfaces of said metal-clad printed circuit board substrate material not covered by resist.

* * * * *